United States Patent [19]

Kallman et al.

[11] Patent Number: 5,694,440
[45] Date of Patent: Dec. 2, 1997

[54] DATA SYNCHRONIZER LOCK DETECTOR AND METHOD OF OPERATION THEREOF

[75] Inventors: Kurt Albert Kallman; Scott David Blanchard, both of Mesa; William Alexander Bucher, Tempe, all of Ariz.

[73] Assignee: Motorola, Inc., Schaumburg, Ill.

[21] Appl. No.: 582,840

[22] Filed: Jan. 2, 1996

[51] Int. Cl.⁶ .................................................. H04L 7/00
[52] U.S. Cl. ........................................ 375/355; 375/324
[58] Field of Search .................................. 375/355, 342, 375/324, 332, 329, 322; 327/161

[56] References Cited

U.S. PATENT DOCUMENTS

| | | | |
|---|---|---|---|
| 4,768,208 | 8/1988 | Cornett | 375/95 |
| 5,452,331 | 9/1995 | Shihabi et al. | 375/324 |

*Primary Examiner*—Stephen Chin
*Assistant Examiner*—Betsy P. Lee
*Attorney, Agent, or Firm*—Walter W. Nielsen; Sherry Whitney

[57] ABSTRACT

In a data synchronizer a timing error estimator samples a received data stream and generates a clock to provide optimal sampling of the data stream, and a lock detector monitors the clock and received data stream to provide an indication of whether optimal sampling has been achieved. The lock detector processes differences between delayed versions of the input which are sampled based upon the clock timing. These sampled differences are then processed by a non-linear circuit to provide a lock signal indication which, when compared to a predetermined threshold signal, is used to provide optimal sampling indication. The lock detector performs computations on real and complex inputs and therefore is compatible with a wide variety of modulation types. The lock detector can be implemented in either analog or digital circuits, making it applicable to a broad range of data synchronizer applications.

14 Claims, 4 Drawing Sheets

DATA SYNCHRONIZER LOCK DETECTOR AND METHOD OF OPERATION THEREOF

RELATED INVENTIONS

The present invention is related to the following inventions which are assigned to the same assignee as the present invention:

(1) U.S. Pat. No. 4,768,208, "Mid-Symbol Sampling Timing Estimator"; and (2) Ser. No. 08/571,979, "Data Synchronizer Phase Detector and Method of Operation Thereof", filed on even date herewith.

TECHNICAL FIELD

The invention relates to signal processing and, in particular, to a data synchronizer lock detector and method of operation thereof.

BACKGROUND OF THE INVENTION

In the field of data communications a wide variety of modulation schemes are known for communicating data. These schemes operate at varying degrees of speed, accuracy, and efficiency. Communications receivers, such as radio receivers, modems, etc., should be capable of accurately and efficiently analyzing received, modulated signals to identify data symbols which have been encoded therein. A "data symbol" represents a unit of information containing one or more bits of data which are encoded for transmission and reception.

A communications receiver can contain a data synchronizer for optimizing the sampling of a received data stream and ultimately producing an accurate reproduction of the transmitted data. A typical data synchronizer comprises a timing error estimator whose timing error signal output is used to adjust the sampling of the received data stream.

It is often necessary to provide an indication as to whether a communications receiver data synchronizer has reached a locked condition and, once this has occurred, an indication is needed if the data synchronizer loses such locked condition. Symbol synchronizer lock detectors are generally a compromise between speed and reliability. This is particularly true with signals employing severe types of filtering.

Therefore, there is a substantial need to provide a timing estimator lock detector which will operate with sampled data and is efficient, accurate, and relatively low in complexity and cost of implementation.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

The present invention provides an improved method and apparatus for lock detection in a data synchronizer. In a data synchronizer a timing error estimator samples a received stream of data and generates a clock to provide optimal sampling of this stream of data, and a lock detector monitors the clock and received stream of data to provide an indication of whether optimal sampling has been achieved. The lock detector processes differences between delayed versions of the input which are sampled based upon the clock timing. These sampled differences are then processed by a non-linear circuit to provide a lock signal indication which, when compared to a threshold signal, is used to provide optimal sampling indication.

Figure 1:
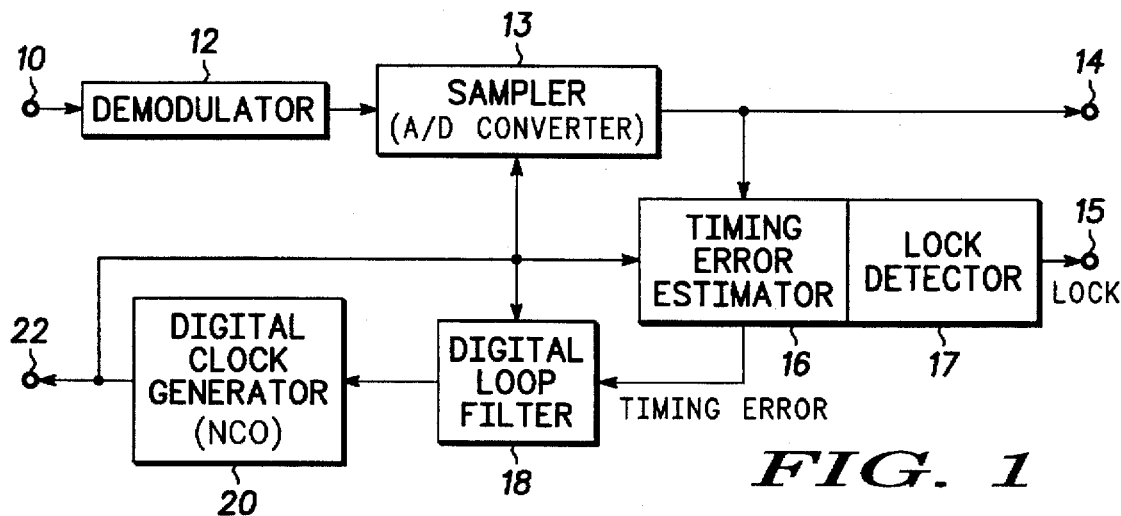
FIG. 1 shows a block diagram of a sampled system which uses a lock detector, in accordance with the present invention.

FIG. 1 shows a block diagram of a sampled system which uses a lock detector in accordance with the present invention. In FIG. 1 an input signal is applied at a terminal 10 as an input of a demodulator 12.

Demodulator 12 removes a carrier or otherwise converts the input signal to an analog signal, or signals, whose amplitude values define the transmitted data symbols. Thus, a sequence of data symbols is provided by the output of demodulator 12 in the form of analog signals. In a preferred embodiment, the sequence of data symbols comprises a real component and an imaginary, or quadrature, component.

It will be understood by one of ordinary skill in the art that the present invention can be implemented either in analog or digital form. In a preferred embodiment the present invention is implemented in a digital (sampled) form.

The output of demodulator 12 couples to the input of a sampler 13, which in a preferred embodiment is an analog-to-digital (A/D) converter, that digitizes the signal to N bits at a rate that is twice the symbol period. The output of the sampler 13 is coupled to a terminal 14 and to an input of a timing error estimator 16. A timing error signal is presented in an output signal from timing error estimator 16. The output of timing error estimator 16 couples to an input of a digital loop filter 18, and an output of digital loop filter 18 couples to a control input of a digital clock generator 20, such as a numerically controlled oscillator.

Clock generator 20 provides the sample timing for a modem, which is merely exemplary of one type of communications receiver which can utilize the present invention. Clock generator 20 provides a signal which controls when the output from demodulator 12 is sampled, i.e. at the desired portion of the demodulated sequence of data symbols. The samples are taken off the input data stream, or the output of demodulator 12, for determination of which one of a predetermined set of possible symbols is encoded into the data stream at the sampled points in time. Samples taken at optimum points in time most accurately reflect symbols encoded in the data stream.

An output from clock generator 20 couples to an output terminal 22, to a timing input of timing error estimator 16, to sampler 13, and to digital loop filter 18. A control loop is formed between timing error estimator 16, loop filter 18, and clock generator 20. Thus, the timing error output value from timing error estimator 16 controls the phase and frequency of clock generator 20 so that sampling of the output signal from demodulator 12 occurs at an optimum time. For example, with increasing (or decreasing) timing error output values, clock generator 20 causes sampling of the data stream to occur earlier, which in turn causes timing error output values to decrease (or increase).

Timing error estimator 16 continues to operate throughout a transmission of data, and the phase of a signal generated by clock generator 20 which samples this data is constantly being adjusted under influence of this control loop so that an optimum sample timing is maintained.

A lock detector circuit 17, shown in greater detail in FIG. 5 and described below, generates a LOCK signal at output terminal 15 to provide an indication of whether optimal sampling has been achieved.

Figure 2:
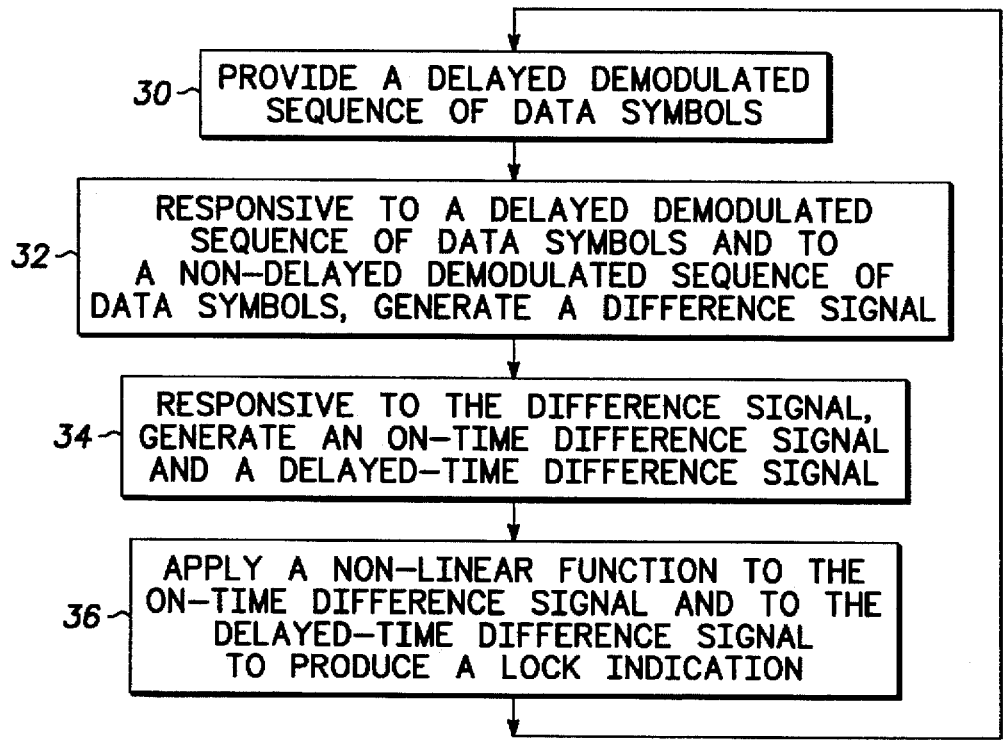
FIG. 2 shows a flow diagram of a method of generating a lock indication, in accordance with the present invention.

FIG. 2 shows a flow diagram of a generalized method of generating a lock indication, in accordance with the present invention.

In block 30, a suitable delay circuit (e.g. delay circuit 146, FIG. 5) is responsive to an input demodulated sequence of data symbols and provides a delayed demodulated sequence of data symbols.

Next, in block 32, a suitable summing or difference circuit (e.g. summing circuit 147, FIG. 5) is responsive to the delayed demodulated sequence of data symbols and to the non-delayed demodulated sequence of data symbols and generates a difference signal.

Next, in block 34, a suitable sampling circuit (e.g. clocked latches 148 and 158, FIG. 5) is responsive to the difference signal and generates an on-time difference signal (e.g. when latch 148 is clocked by CLK) and a delayed-time difference signal (e.g. when latch 158 is clocked by CLK').

Next, in block 36, a suitable signal processor circuit performing a non-linear function is responsive to the on-time difference signal and to the delayed-time difference signal to produce a lock indication. For example, in FIG. 5 circuits 149 and 159, respectively, determine the absolute values of the on-time difference signal and the delayed-time difference signal. These values are then combined by summing circuit 160 to produce a LOCK signal. (It will be understood by one of ordinary skill in the art that the LOCK signal corresponding to only the real component of the demodulated sequence of data symbols can suffice to provide a suitable control function within the context of a particular data synchronizer circuit.)

The process continuously repeats itself by proceeding from block 36 to block 30.

Figure 3:
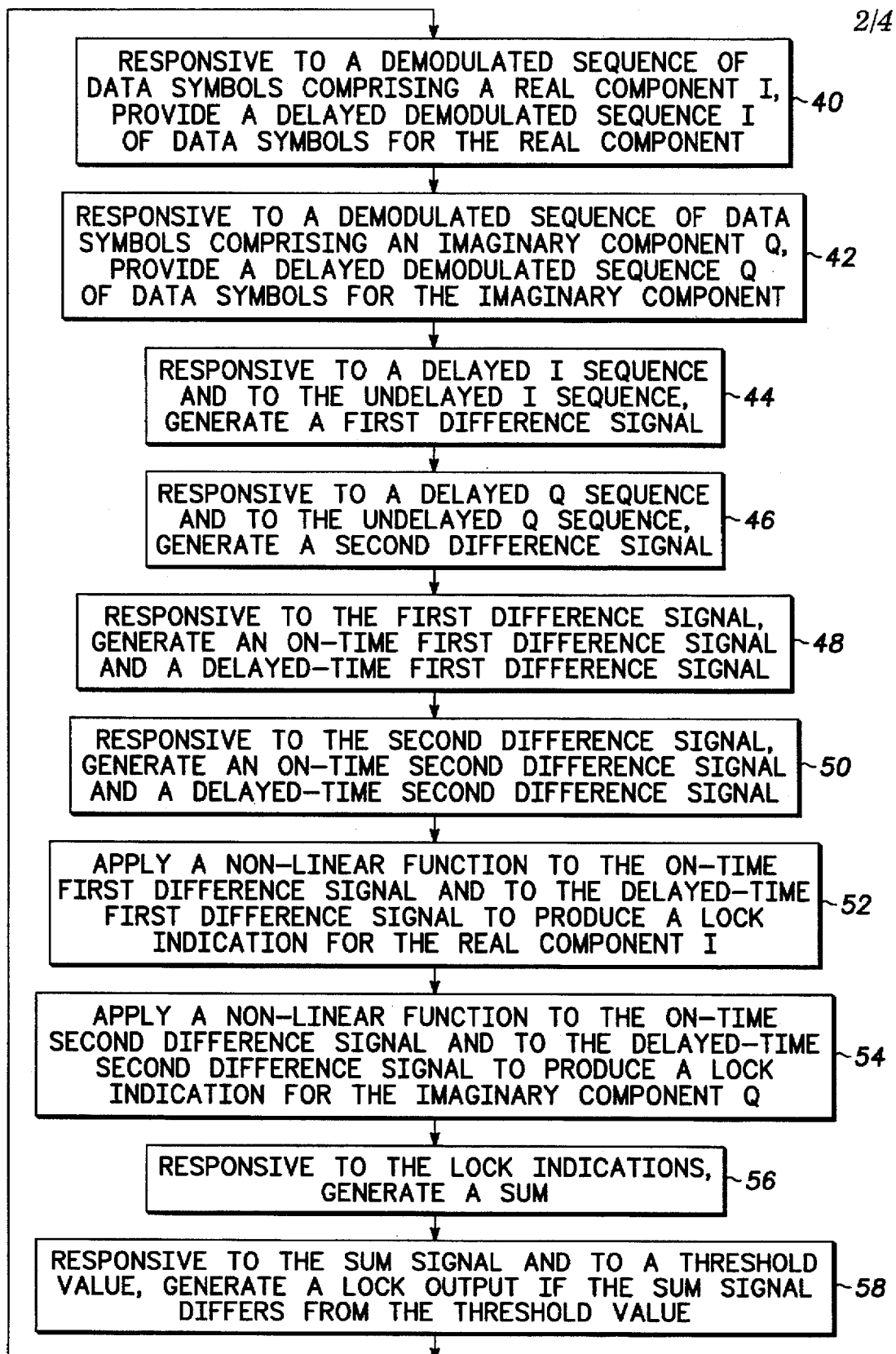
FIG. 3 shows a more detailed flow diagram of a method of generating a lock indication, in accordance with the present invention.

FIG. 3 shows a more detailed flow diagram of a method of generating a lock indication, in accordance with the present invention. The flow diagram shown in FIG. 3 is suitable for handling a demodulated sequence of data symbols having both a real and an imaginary component.

In block 40, a suitable delay circuit (e.g. delay circuit 146, FIG. 5) is responsive to an input demodulated sequence of data symbols and provides a delayed demodulated sequence I of data symbols for the real component.

Next, in block 42, a suitable delay circuit (e.g. delay circuit 166, FIG. 5) is responsive to the input demodulated sequence of data symbols and provides a delayed demodulated sequence Q of data symbols for the imaginary component.

Next, in block 44, a suitable summing or difference circuit (e.g. summing circuit 147, FIG. 5) is responsive to the delayed demodulated sequence I of data symbols and to the non-delayed demodulated sequence I of data symbols and generates a first difference signal.

Next, in block 46, a suitable summing or difference circuit (e.g. summing circuit 167, FIG. 5) is responsive to the delayed demodulated sequence Q of data symbols and to the non-delayed demodulated sequence Q of data symbols and generates a second difference signal.

Next, in block 48, a suitable sampling circuit (e.g. clocked latches 148 and 158, FIG. 5) is responsive to the first difference signal and generates an on-time first difference signal (e.g. when latch 148 is clocked by CLK) and a delayed-time first difference signal (e.g. when latch 158 is clocked by CLK').

Next, in block 50, a suitable sampling circuit (e.g. clocked latches 168 and 178, FIG. 5) is responsive to the second difference signal and generates an on-time second difference signal (e.g. when latch 168 is clocked by CLK) and a delayed-time second difference signal (e.g. when latch 178 is clocked by CLK').

It will be understood by one of ordinary skill in the art that when using the lock detector for offset or staggered modulation formats which have the property that the optimal symbol timing for the imaginary (Q) channel is exactly one-half a symbol offset from the real (I) channel, that the CLK and CLK' signals used in block 50 should be delayed by half a symbol time relative to the CLK and CLK' signals used in block 48.

Next, in block 52, a suitable circuit performing a nonlinear function is responsive to the on-time first difference signal and to the delayed-time first difference signal to produce a lock indication for the real component. For example, in FIG. 5 circuits 149 and 159, respectively, determine the absolute values of the on-time first difference signal and the delayed-time first difference signal. Summing circuit 160 generates the difference between these values to produce a $LOCK_I$ signal.

Next, in block 54, a suitable circuit performing a nonlinear function is responsive to the on-time second difference signal and to the delayed-time second difference signal to produce a lock indication for the imaginary component Q. For example, in FIG. 5 circuits 169 and 179, respectively, determine the absolute values of the on-time second difference signal and the delayed-time second difference signal. Summing circuit 180 generates the difference between these values to produce a $LOCK_Q$ signal.

It will be understood by one of ordinary skill in the art that an alternative suitable circuit for performing a non-linear function could replace absolute value circuits 149, 159, 169, and 179, such as a circuit for providing a square, fourth law, or a weighted summation of even powers of a signal input.

Next, in block 56, the values of lock indications $LOCK_I$ and $LOCK_Q$ are then summed by summing circuit 182 to produce a $LOCK_I + LOCK_Q$ sum signal.

Next, in block 58, a suitable circuit such as comparator 186 (FIG. 5) is responsive to the $LOCK_I + LOCK_Q$ sum signal and to a THRESHOLD value and generates a LOCK output if the $LOCK_I + LOCK_Q$ signal differs from the THRESHOLD value. It will be understood by those of ordinary skill in the art that, to optimize the performance of the method, a succession of values of the $LOCK_I + LOCK_Q$ signal can be estimated or averaged over time, i.e. over a predetermined number of operational cycles of the circuit.

The process continuously repeats itself by proceeding from block 58 to block 40.

Figure 4:
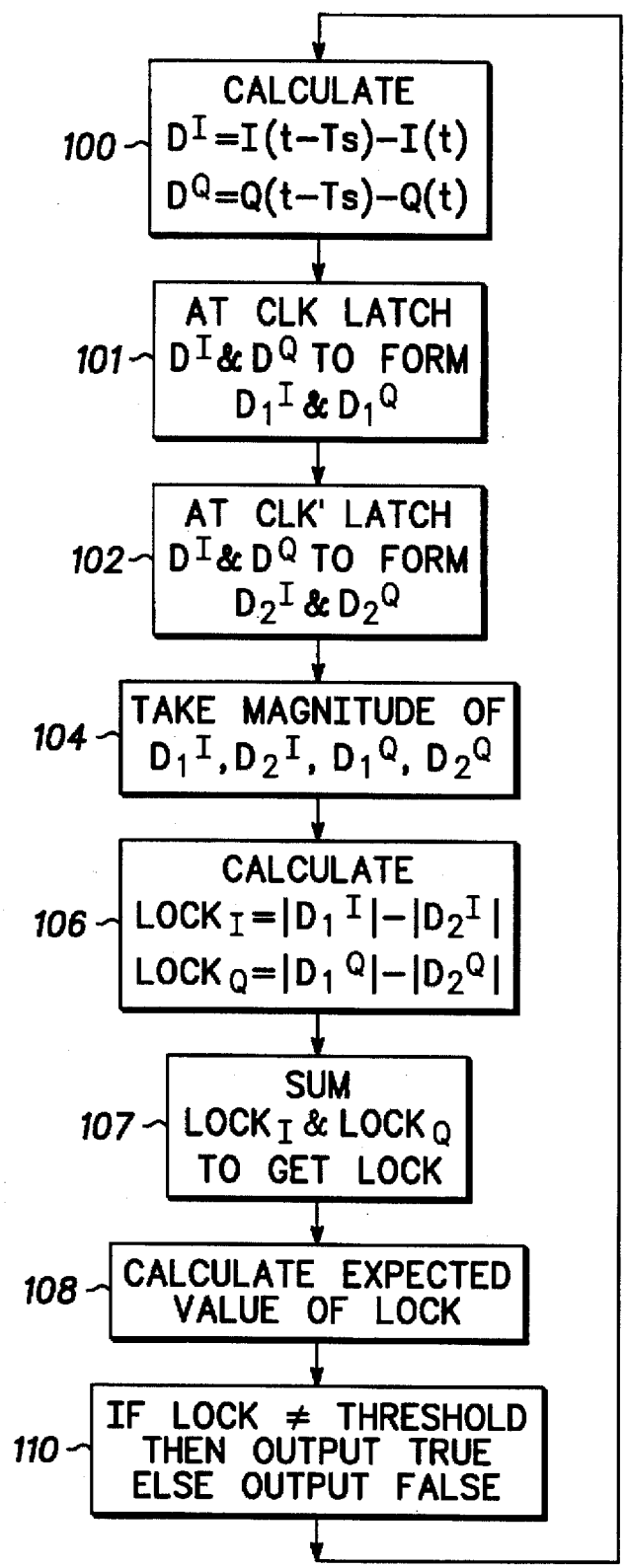
FIG. 4 shows a flow diagram of a method of generating a lock indication, in accordance with a preferred embodiment of the present invention.
Figure 5:
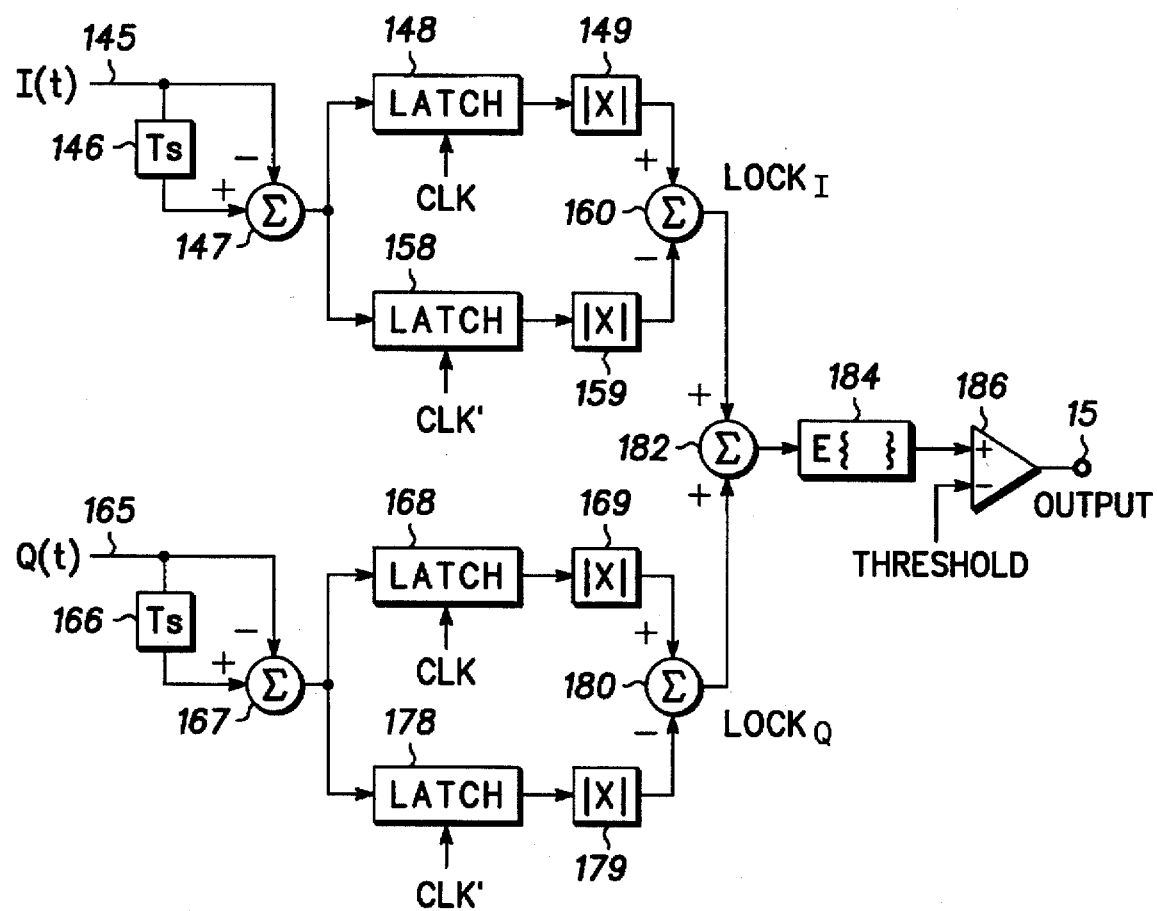
FIG. 5 shows a block diagram of a lock detect circuit, in accordance with a preferred embodiment of the present invention.

FIG. 4 shows a flow diagram of a method of generating a lock indication, in accordance with a preferred embodiment of the present invention, and With reference to the lock detect circuit shown in FIG. 5.

First, the process begins in box 100, wherein the difference $D^I$ between the value of the real, or in-phase, signal component at time t, represented by I(t), and at time t−Ts, represented by I(t−Ts), is being instantaneously calculated (e.g. by summing circuit 147, FIG. 5). Ts represents the time or period between successive symbols in the data stream.

Also the difference $D^Q$ between the values of the imaginary, or quadrature, signal component at time t, represented by Q(t), and at time t−Ts, represented by Q(t−Ts), is also being instantaneously calculated (e.g. by summing circuit 167, FIG. 5).

In a preferred embodiment, the CLK signal has a 50% duty cycle, i.e., the CLK and CLK' signals are 180 degrees out of phase with respect to one another. However, it will be understood by those of ordinary skill in the art that other duty cycles can be used as appropriate.

Next, in box 101 the values of $D^I$ and $D^Q$ are latched for each positive-going transition of the CLK signal. For example, referring to FIG. 5, $D_1^I$ is latched into latch circuit 148, and $D_1^Q$ is latched into latch circuit 168. The values of $D_1^I$ and $D_1^Q$ are given by the following equations:

$$D_1^I = I(t-Ts) - I(t) \text{ at } t=t_0 \qquad \text{Equation 1}$$

$$D_1^Q = Q(t-Ts) - Q(t) \text{ at } t=t_0 \qquad \text{Equation 2}$$

where $t_0$ represents the positive-going transition in the CLK signal.

Next, in box 102 the values of $D_2^I$ and $D_2^Q$ are latched for each positive-going transition of the CLK' signal. For example, referring to FIG. 5, $D_2^I$ is latched into latch circuit 158, and $D_2^Q$ is latched into latch circuit 178. The values of $D_2^I$ and $D_2^Q$ are given by the following equations:

$$D_2^I = I(t-Ts) - I(t) \text{ at } t=t_0+\Delta t \qquad \text{Equation 3}$$

$$D_2^Q = Q(t-Ts) - Q(t) \text{ at } t=t_0+\Delta t \qquad \text{Equation 4}$$

where $\Delta t$ represents the amount of delay in the delayed clock signal CLK'.

It will be understood by one of ordinary skill in the art that when using the lock detector for offset or staggered modulation formats which have the property that the optimal symbol timing for the imaginary (Q) channel is exactly one-half a symbol offset from the real (I) channel, that the delayed CLK' should be used to latch $D_1^Q$ in box 101 and CLK should be used to latch $D_2^Q$ in box 102.

Next, in box 104 the magnitudes of $D_1^I$, $D_2^I$, $D_1^Q$, and $D_2^Q$ are calculated by absolute value circuits 149, 159, 169, and 179 (FIG. 5), respectively.

Next in box 106 the following calculations are performed:

$$LOCK_I = ||D_1^I| - |D_2^I|| \qquad \text{Equation 5}$$

$$LOCK_Q = ||D_1^Q| - |D_2^Q|| \qquad \text{Equation 6}$$

In Equation 5, the difference between the absolute values of $D_1^I$ and $D_2^I$ is calculated by summing circuit 160 (FIG. 5), which generates a $LOCK_I$ signal. In Equation 6, the difference between the expected values of $D_1^Q$ and $D_2^Q$ is calculated by summing circuit 180 (FIG. 5), which generates a $LOCK_Q$ signal.

Next, in box 107 $LOCK_I$ and $LOCK_Q$ are summed to generate LOCK (e.g. by summing circuit 182, FIG. 5).

Next, in box 108 the average (or expected) value of LOCK is calculated by mean value estimating circuit 184 (FIG. 5). It will be apparent to one of ordinary skill in the art that the expected or average value can be determined in any suitable manner or in a suitably equivalent manner, such as by using a low pass filter, a sliding window, or an appropriate software algorithm.

Next, in box 110 a comparison is made between the average value of LOCK and a predetermined THRESHOLD value. If the value of LOCK differs from the THRESHOLD, then the circuit output is set TRUE; otherwise, the circuit output is set FALSE. The process then returns to box 100 via line 60. It will be understood that the process repeats in a constant loop. The LOCK output, representing a lock detect signal, provides an indication, which is appropriately utilized, for example, by the data synchronizer shown in FIG. 1, as to whether optimal sampling has been achieved.

It will be understood by one of ordinary skill in the art that if the number of equations is desired to be reduced at the expense of lock indication performance, only the I channel computations (Equations 1, 3, and 5) need be performed and box 107 can be eliminated.

FIG. 5 shows a block diagram of a lock detect circuit, in accordance with a preferred embodiment of the present invention.

The real signal component I(t) is coupled via line 145 to the minus input of summing circuit 147. Real signal component I(t) is also delayed by sample period Ts by delay circuit 146, with the resulting delayed signal I(t−Ts) being coupled to the plus input of summing circuit 147. The output of summing circuit 147 is fed into latches 148 and 158. Latches 148 and 158 are clocked by CLK and CLK', respectively.

In similar fashion, the imaginary signal component Q(t) is coupled via line 165 to the minus input of summing circuit 167. Imaginary signal component Q(t) is also delayed by sample period Ts by delay circuit 166, with the resulting delayed signal Q(t−Ts) being coupled to the plus input of summing circuit 167. The output of summing circuit 167 is fed into latches 168 and 178. Latches 168 and 178 are clocked by CLK and CLK', respectively.

The outputs of latches 148 and 158 go into absolute value circuits 149 and 159, respectively, and the outputs of latches 168 and 178 go into absolute value circuits 169 and 179, respectively.

The outputs of absolute value circuits 149 and 159 go into the plus and minus inputs, respectively, of summing circuit 160. The output of summing circuit 160 represents the $LOCK_I$ signal. Similarly, the outputs of absolute value circuits 169 and 179 go into the plus and minus inputs, respectively, of summing circuit 180. The output of summing circuit 180 represents the $LOCK_Q$ signal.

The $LOCK_I$ and $LOCK_Q$ signals are applied to the inputs of summing circuit 182. The output of summing circuit 182 is fed into the input of mean value estimating circuit 184, whose output is coupled to the positive input of comparator 186. A THRESHOLD value of predetermined, appropriate value is coupled to the negative input of comparator 186. The output of comparator represents the LOCK output signal.

It will be understood by one of ordinary skill that the lock detector circuit shown and described in FIG. 5 is intended for non-offset data formats. For use with offset data formats, the CLK and CLK' signals should be interchanged for the latches in the Q channel only.

It will be understood by one skilled in the art that for real modulation formats such as BPSK, or if reduced circuit complexity is desired at the expense of reduced lock detection performance, the Q channel circuits (166–169 and 178–180) can be eliminated. Summing circuit 182 can then also be eliminated, with the output of summing circuit 160 being coupled directly to mean value estimating circuit 184.

In summary, the method and apparatus of the present invention represents a lock detector that is computationally efficient and operates with the heavy filtering normally associated with higher order formats. The lock detector performs computations on real and complex inputs and therefore is compatible with a wide variety of modulation types. The present invention operates with offset and non-offset modulation types in addition to modulation schemes ranging from simple binary phase shift keying (PSK) to 256-QAM (quadrature amplitude modulation).

The lock detector can be implemented in either analog or digital circuits, making it applicable to a broad range of data synchronizer applications. It does not require computationally intensive operations such as division, so it can be implemented with a minimum number of gates and hence consumes relatively little power and semiconductor chip area and is relatively low in cost.

It will be apparent to those skilled in the art that the disclosed invention can be modified in numerous ways and can assume many embodiments other than the preferred form specifically set out and described above. For example, the present invention can be implemented either in digital circuitry or by a programmed digital computer. In addition, the mean value estimating circuits and latches can be placed at any appropriate location within the lock detection circuit. Further, any suitable signal processor circuit performing a non-linear function may be employed, as appropriate, such as a squarer, fourth-law function, and the like.

Accordingly, it is intended by the appended claims to cover all modifications of the invention which fall within the true spirit and scope of the invention.

What is claimed is:

1. A method of generating a lock detect signal in a data synchronizer lock detector having a delay circuit responsive to a demodulated sequence of data symbols, a summing circuit, a sampler, and a signal processor, the method comprising the steps of:

providing a delayed demodulated sequence of data symbols:

responding to said delayed demodulated sequence of data symbols and to said demodulated sequence of data symbols and generating a difference signal;

responding to said difference signal and generating an on-time difference signal and a delayed-time difference signal; and applying a non-linear function to said on-time difference signal and to said delayed-time difference signal to produce a lock indication.

2. The method recited in claim 1, wherein said data synchronizer lock detector is a component of a radio receiver.

3. The method recited in claim 1, wherein said data synchronizer lock detector is a component of a modem.

4. A method of generating a lock detect signal in a data synchronizer lock detector having first and second delay circuits, first, second, and third summing circuits, first and second samplers, first and second signal processors, and a comparator, the method comprising the steps of:

(a) providing a delayed demodulated sequence I of data symbols for a real component by responding to a demodulated sequence of data symbols comprising said real component;

(b) providing a delayed demodulated sequence Q of data symbols for an imaginary component by responding to a demodulated sequence of data symbols comprising said imaginary component:

(c) responding to said delayed demodulated sequence I and to said demodulated sequence I and generating a first difference signal;

(d) responding to said delayed demodulated sequence Q and to said demodulated sequence Q and generating a second difference signal;

(e) responding to said first difference signal and generating an on-time first difference signal and a delayed-time first difference signal;

(f) responding to said second difference signal and generating an on-time second difference signal and a delayed-time second difference signal;

(g) applying a non-linear function to said on-time first difference signal and to said delayed-time first difference signal to produce a lock indication for said real component;

(h) applying a non-linear function to said on-time second difference signal and to said delayed-time second difference signal to produce a lock indication for said imaginary component;

(i) responding to said lock indications and generating a sum signal; and (j) responding to said sum signal and to a threshold value and generating a lock output if said sum signal differs from said threshold value.

5. The method recited in claim 4, wherein said data synchronizer lock detector further comprises an averaging circuit, and said method comprises the steps of:

(k) repeating steps (a) through (i) a predetermined number of cycles;

(l) said averaging circuit determining an average of the values of said sum signal generated during said cycles; and wherein in step (j) said comparator is responsive to the average of the values of said sum signal and to said threshold value.

6. The method recited in claim 4, wherein said data synchronizer lock detector is a component of a radio receiver.

7. The method recited in claim 4, wherein said data synchronizer lock detector is a component of a modem.

8. A data synchronizer lock detector, responsive to a demodulated sequence of data symbols, said lock detector comprising:

a delay circuit responsive to said demodulated sequence of data symbols, said delay circuit providing a delayed demodulated sequence of data symbols;

a summing circuit responsive to said delayed demodulated sequence of data symbols and to said demodulated sequence of data symbols and generating a difference signal;

a sampler responsive to said difference signal and generating an on-time difference signal and a delayed-time difference signal; and a signal processor applying a non-linear function to said on-time difference signal and to said delayed-time difference signal to produce a lock indication.

9. The data synchronizer lock detector recited in claim 8, wherein said data synchronizer lock detector is a component of a radio receiver.

10. The data synchronizer lock detector recited in claim 8, wherein said data synchronizer lock detector is a component of a modem.

11. A data synchronizer lock detector comprising:

first and second delay circuits, said first delay circuit responsive to a demodulated sequence of data symbols comprising a real component and providing a delayed demodulated sequence I of data symbols for said real component, and said second delay circuit responsive to a demodulated sequence of data symbols comprising an imaginary component and providing a delayed demodulated sequence Q of data symbols for said imaginary component;

first and second summing circuits, said first summing circuit being responsive to said delayed demodulated sequence I and to said demodulated sequence I and generating a first difference signal, and said second summing circuit being responsive to said delayed demodulated sequence Q and to said demodulated sequence Q and generating a second difference signal;

first and second samplers, said first sampler being responsive to said first difference signal and generating an on-time first difference signal and a delayed-time first difference signal, and said second sampler being responsive to said second difference signal and generating an on-time second difference signal and a delayed-time second difference signal;

a signal processor, said signal processor applying a non-linear function to said on-time first difference signal and to said delayed-time first difference signal to produce a lock indication for said real component, and said signal processor applying a non-linear function to said on-time second difference signal and to said delayed-time second difference signal to produce a lock indication for said imaginary component;

a third summing circuit, said third summing circuit being responsive to said lock indications and generating a sum signal; and a comparator responsive to said sum signal and to a threshold value and generating a lock output if said sum signal differs from said threshold value.

12. The data synchronizer lock detector recited in claim 11, and further comprising an averaging circuit responsive to the output of said third summing circuit for determining an average of the values of said sum signal generated during several cycles, and wherein said comparator is responsive to said average of the values of said sum signal.

13. The data synchronizer lock detector recited in claim 11, wherein said data synchronizer lock detector is a component of a radio receiver.

14. The data synchronizer lock detector recited in claim 11, wherein said data synchronizer lock detector is a component of a modem.

* * * * *